US005196755A

United States Patent [19]

Shields

[11] Patent Number: 5,196,755

[45] Date of Patent: Mar. 23, 1993

[54] PIEZOELECTRIC PANEL SPEAKER

[76] Inventor: F. Douglas Shields, Rte. 6, Box 246, Oxford, Miss. 38655

[21] Appl. No.: 873,777

[22] Filed: Apr. 27, 1992

[51] Int. Cl.[5] .......... H01L 41/08

[52] U.S. Cl. .......... 310/324; 310/322; 310/345; 310/340; 381/190

[58] Field of Search .......... 310/322, 324, 331, 334, 310/337, 800; 381/182, 184, 186, 190, 203

[56] References Cited

U.S. PATENT DOCUMENTS

| | | | |
|---|---|---|---|
| 4,040,428 | 8/1977 | Clifford | 128/351 |
| 4,233,477 | 11/1980 | Rice et al. | 310/334 X |
| 4,641,054 | 2/1987 | Takahata | 310/324 |
| 4,654,554 | 3/1987 | Kishi | 381/158 |
| 4,751,419 | 6/1988 | Takahata | 310/324 |
| 4,969,197 | 11/1990 | Takaya | 381/190 |
| 4,975,616 | 12/1990 | Park | 310/339 |
| 5,005,665 | 4/1991 | Cheung | 181/101 |
| 5,031,222 | 7/1991 | Takaya | 381/190 |

*Primary Examiner*—Mark O. Budd

*Attorney, Agent, or Firm*—Bacon & Thomas

[57] ABSTRACT

An acoustic transducer system includes a plurality of individual transflexural piezoelectric elements potted in a plastic or rubber compound. The panel is able to radiate broad-band, high intensity sound waves in a controllable radiation pattern.

10 Claims, 2 Drawing Sheets

PIEZOELECTRIC PANEL SPEAKER

BACKGROUND OF THE INVENTION

This invention was made with government support under grant N0001490-J-4068 awarded by the Department of the Navy. The government has certain rights in the invention.

1. Field of the Invention

This invention relates to an electroacoustic transducer device for converting an electrical signal into sound, including subsonic or ultrasonic sound, in a gas such as air or in a liquid such as water. More particularly, the invention relates to the combination of a driver and a structural radiation aide for an electroacoustic transducer device. Still more particularly, the invention relates to an electroacoustic transducer device in which the driver is in the form of a plurality of piezoelectric driver elements and the structural radiation aide is a flexible panel.

2. Description of Related Art

A piezoelectric material is a material which, upon application of an electrical voltage, converts the voltage into a mechanical vibration or, conversely, converts mechanical vibrations into electrical signals. Consequently, piezoelectric materials have long been used in electroacoustic receivers and transmitters.

A drawback of using piezoelectric materials in electroacoustic transducer devices is that such devices generally perform much better at high frequencies than at low frequencies because, although very large forces can be produced by applying electric fields to the constrained piezoelectric crystals or ceramics used as driver elements in electroacoustic transducer devices, the accompanying strain is relatively small. In other words, it is difficult to get the large vibrational amplitudes needed for high intensity, low frequency sound using piezoelectric devices. In addition, the mechanical impedances of piezoelectric materials are generally closest to those of liquids and solids, rather than gases, thus limiting the energy transfer efficiency of piezoelectric electroacoustic devices designed for use in air, such as loudspeakers.

A number of ingenious schemes have been devised for introducing a mechanical advantage that would reduce the driving force in exchange for increasing the force distance of a piezoelectric driver element. One such scheme is to provide the commercially available device 1 illustrated in FIGS. 1 and 2. The device 1 includes a thin layer of piezoelectric ceramic material 2 bonded to a thin conductive metal disc 3, made for example of brass, bonded via a flexible adhesive layer 7 to a conductive metal ring 6, also made of brass. When an electric voltage is applied between the surfaces of the thin ceramic disc, the disc varies in thickness, and also in radius. The relatively large forces of expansion and contraction produced are transferred to the surface of the metal disc 3 to which the ceramic is bonded, with the effect that the disc bows up in the center when the ceramic disc expands, and down when the ceramic disc contracts.

Performance is improved by loosely bonding a second conductive metal disc 5, including a second piezoelectric layer 4, to the metal ring 6 to form a capsule 1. When the two ceramic layers are subjected to attenuating electrical fields, the thickness of the capsule varies with the frequency of the applied voltage, thereby changing the electrical signal into a radiated soundwave.

While the low frequency performance of the above-described transducer, also known as a transflexural piezoelectric element, is greatly improved relative to other conventional piezoelectric drive arrangements, the intensity of sound which can be radiated is nevertheless limited, and the directionality of the sound cannot be controlled. In addition, the radiating area possible with such transducers is relatively small, the bandwidth is relatively narrow and, in the case of ordinary loudspeakers, expensive and difficult-to-design enclosures are needed in order to eliminate the effect of cancellation between positive and negative pressures which occurs at low frequencies because the wavelengths generated are greater than the size of the enclosure. Further, the problem of impedance mismatches makes this type of element unsuitable for use in air. The specific driver shown in FIG. 1, for example, has previously been used only as a single element for sensing and generating underwater vibrations.

In an extension of the well-known concept of placing a driver in a paper speaker cone for purposes of controlling the mechanical impedance and frequency range of an audio loudspeaker element, it has also previously been proposed to arrange a plurality of piezoelectric elements between two opposed rigid plane resin foam plates, each having multiple recesses, each of the recesses accommodating a piezoelectric driver. The recesses are bigger than the drivers and extensions of the plate are provided for supporting the substantial centers of the drivers.

The plane resin foam plate type of piezoelectric speaker structure is disclosed in U.S. Pat. Nos. 4,969,197 and 5,031,222, both to Takaya. The intent of the two patents is to provide a device in which the two rigid resin foam plates forming the speaker diaphragm or radiation aide are vibrated by driving the piezoelectric drivers, causing sound to be emitted from both main surfaces of the diaphragm. Significantly, each piezoelectric driver is in the form of a single metal disc with a piezoelectric material bonded to it and which is contained in the space of the diaphragm without being contacted by any other element, except for the center supports. Consequently, the rigid resin foam plates do not restrict vibration of the edges of the piezoelectric driver.

As is best shown in FIG. 1 of U.S. Pat. No. 4,969,197, the multiple driver piezoelectric speaker structure of Takaya was intended to be an improvement over prior art structures in which the piezoelectric driver is completely enclosed in foam. The completely enclosed driver was believed to be impractical because the vibration of the piezoelectric driver element, which is simply a vibrating film on which the piezoelectric elements are attached, cannot overcome the resistance of the foam plate in order to provide sufficient output intensity.

Therefore, although it has previously been proposed to enclose piezoelectric driver elements completely within a foam element to form a diaphragm or sounding board, the approach was found to be unsatisfactory because the foam overly restricted the vibration of the conventional piezoelectric element. The present invention makes it possible to overcome this problem and provide a piezoelectric panel in which recesses of the type disclosed by Takaya are unnecessary by utilizing a different type of piezoelectric driver element, shown in FIGS. 1 and 2, which had previously not been considered for use in panel arrangements.

In addition, the previous foam plate diaphragm structures suffered from the limitations that foam is porous, and therefore not suitable for use in liquids and corrosive environments, and that the foam used could not easily be shaped or bent for use in restricted spaces. The present invention overcomes these limitations by potting the driver elements in a material which is both non-porous and flexible.

SUMMARY OF THE INVENTION

It is an objective of the invention to overcome the limitations of conventional piezoelectric acoustic transducer systems by providing a piezoelectric acoustic transducer system in which all of the following advantages are all present:

the intensity of the sound radiated can be increased by increasing the number of elements;

the directionality of the sound can be controlled;

the radiating area is larger than the sum total of the areas of the transducing element, thereby allowing the generation and radiation of low frequency sounds not possible with individual drivers;

the thin flexible panel can be mounted on a rigid backing, removing the necessity for expensive and difficult to design enclosures needed for ordinary speakers and in which individual elements of different resonant frequencies can be provided, thereby increasing the band of frequencies covered, and also permitting use in restricted spaces in a large variety of applications; and the panel can be used underwater and in corrosive environments, and has greater resistance to ordinary environmental degradation from moisture and airborne pollutants.

These objectives are achieved by providing a piezoelectric panel speaker in which a plurality of transflexural piezoelectric speaker elements of the type including a pair of conductive metal discs, each having a piezoelectric material layer affixed to axially opposed external surfaces thereof and which are bonded to a ring member, are assembled into a thin flat flexible panel such that the array of piezoelectric drivers has sound radiating and sensing capabilities not possessed by the individual elements or by prior piezoelectric driver arrays.

The transflexural piezoelectric driver elements described above are driven by subjecting the two piezoelectric layers, which are preferably ceramics, to alternating electrical fields, thus varying the thickness of the resulting capsule with the frequency of the applied electrical voltage, and thereby changing the electrical signal into a radiated soundwave.

The individual piezoelectric driver elements or capsules are combined into a panel which serves as the structural radiation aide by encapsulating an array of the elements in a flexible material. By increasing the number of driver elements, the intensity of the sound radiated can be increased. Control of the directionality of the sound is obtained by the extended area of the active surface which limits the beam width. In addition, by introducing concave or convex surfaces, the beam can be focused or diverged, and by phasing the array, the beam can also be focused or made to sweep through a specified volume. The large area of the array allows the generation and radiation of low frequency sound not possible with a smaller radiating area. In addition, the panel can be mounted on a rigid backing, removing the necessity for expensive and difficult-to-design enclosures needed for ordinary loud speakers and other acoustoelectric transducer devices. Finally, by including in the array individual elements with different resonant frequencies, the band of frequencies covered can be increased.

A relatively flat frequency response from low to high frequencies is possible in part because of the way the capsules are assembled and potted. The metal discs are bonded to the flat metal ring with a flexible epoxy. This allows the capsules to expand and contract in the thickness direction with a minimum compensating change in the radial direction and eliminates unwanted resonances. In conventional piezoceramic discs, the radial motion of the disc reduces the average change in thickness of the panel and thereby reduces the sound radiated. The flat frequency response of the panel is also influenced by potting material, thickness, and procedure.

DETAILED DESCRIPTION OF THE PREFERRED EMBODIMENTS

Figure 3:
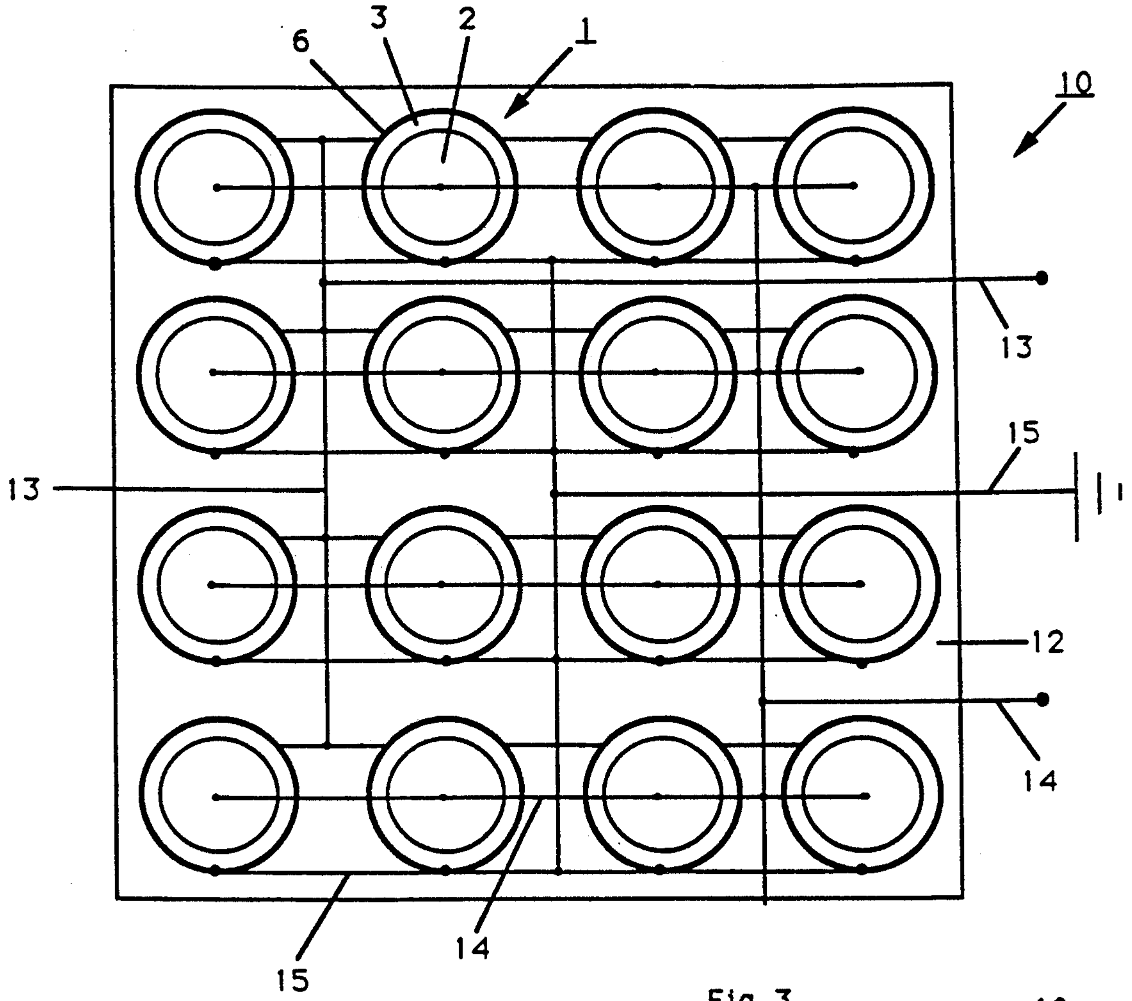
FIG. 3 is a top elevation of a piezoelectric electroacoustic transducer panel constructed in accordance with the principles of the preferred embodiment of the invention.
Figure 4:
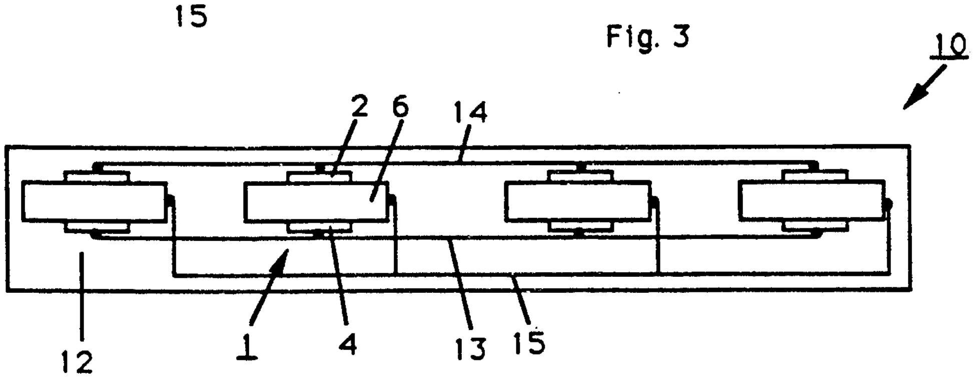
FIG. 4 is a side elevation of the electroacoustic transducer panel of FIG.

FIGS. 3 and 4 show a preferred embodiment of the invention that can be use in water or air.

Figure 1:
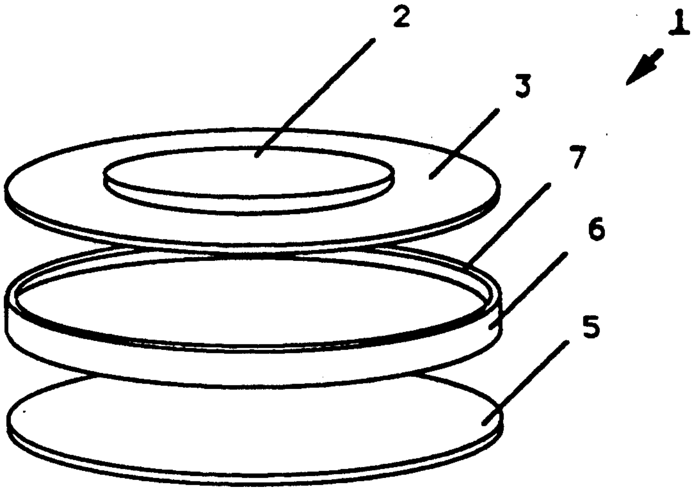
Fig. 1 (Prior Art)
FIG. 1 is an exploded perspective view of a piezoelectric driver element or capsule for use in an electroacoustic transducer panel constructed in accordance with the principles of a preferred embodiment of the invention.
Figure 2:
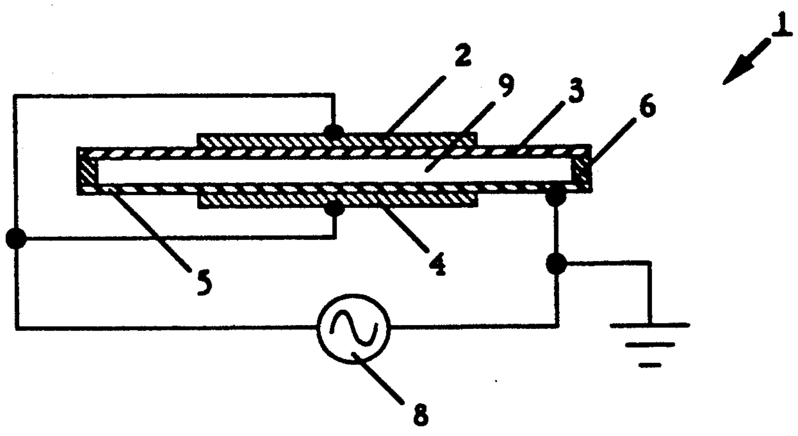
Fig. 2 (Prior Art)
FIG. 2 is a cross-sectional side view of the capsule of FIG. 1, including a schematic diagram of driver circuitry therefor.

A plurality of individual driver elements or capsules 1 of the type shown in FIGS. 1 and 2 are potted in a flexible layer 12 a few millimeters thick to form an electroacoustic transducer panel 10. The properties, thickness, and curing procedure of the potting material may be varied, depending on the material used, to obtain the desired damping of the vibrating capsules and thus to control the frequency response, as would be readily understood by those skilled in the art. Examples of suitable materials include the polyurethane material Uralite TM, polyvinyl materials, and rubber, which have the advantage that they are water resistant or waterproof, and generally able to protect the driver elements from moisture and other contaminants, thereby enabling use of the panel underwater and in corrosive environments such as may be found in the active noise control systems currently under development. In addition, it will be appreciated by those skilled in the art that the rigid ring member or support 6 of an individual capsule 1 need not be completely annular, and that discs 3 and 5 may be in the form of plates which are not completely circular in shape.

In the preferred embodiment of the invention, the potting is done under vacuum, with the result that the space inside each capsule 1, i.e., between the conductive plates 3 and 5, and inside the rigid ring 6, is evacuated. When subjected to the pressure of the atmosphere or liquid head pressure, the elements are prestressed with a concave curvature. The elements could also be prestressed in the positive direction by pressurizing the volume between the discs during the potting process. The amount of prestressing may be varied to control the frequency response by varying the amount of evacuation, the materials used, and so forth.

It will of course be appreciated by those skilled in the art that the frequency response of the panel is influenced by the resonant frequency of the individual capsules and therefore may be controlled by varying the thickness and diameter of the metal discs, the ceramic discs, and the metal ring. In addition, the piezoelectric layers need not necessarily be placed on outside surfaces of the capsule, but rather may be placed on either one or both of the respective principal planar surfaces of the two plates 3 and 5.

Also, the number of elements can be varied to control radiation patterns and sound levels generated. To increase the range of the frequency response capsules, a range of resonant frequencies are included in a single panel, or a mosaic of panels can be built up with each panel having an individually controlled frequency range. The result is a panel speaker device that does not require a resonant enclosure and can be made into a thin flexible panel capable of mounting on flat or curved surfaces, or in water, and having a very useful low frequency response, bandwidth, and high sound output.

As shown in FIGS. 3 and 4, the elements are wired in parallel via lines 13 and 14, which are connected together and to the outer surfaces of the piezoelectric ceramic layers of individual elements. Lines 13 and 14 are connected together and to an electrical signal source of the type schematically depicted in FIG. 2. Line 15 connects the other side of the signal source to the metal rings and to ground. However, the elements can also be wired in series or some combination of series and parallel in order to control the panel's electrical impedance. Finally, although ring 6 is illustrated as being conductive, it could also be made of a rigid non-conductive material, in which a case jumper would need to be electrically connected to plates 3 and 5, or wire 15 could be branched appropriately.

Having thus described in detail a panel speaker arrangement utilizing piezoelectric speaker elements, it should nevertheless be appreciated that variations of the embodiment described above are possible within the scope of the invention. Consequently, it is intended that the invention not be limited by the above description, but rather that it be limited solely by the appended claims.

I claim:

1. An acoustic transducer device, comprising:

an array of piezoelectric driver elements, each of said piezoelectric driver elements including a support member, a pair of conductive plates loosely bonded to said support member to form a space between the plates, and a pair of piezoelectric layers on at least one surface of each of said pair of plates;

means for electrically connecting said piezoelectric driver elements to a varying electrical signal source for causing said piezoelectric layers to expand and contract, causing said plates to vibrate with a transflexural motion at a frequency of expansion and contraction of said layers; and means including a panel made of a flexible material in which said piezoelectric driver elements and connecting means are potted.

2. A device as claimed in claim 1, wherein said support members are conductive metal rings.

3. A device as claimed in claim 1, wherein said support members are each connected to ground.

4. A device as claimed in claim 1, wherein said conductive metal plates are discs.

5. A device as claimed in claim 1, wherein said panel is made of a non-porous material.

6. A device as claimed in claim 1, wherein said panel is made of polyurethane.

7. A device as claimed in claim 1, wherein said panel is made of a polyvinyl material.

8. A device as claimed in claim 1, wherein said panel is made of rubber.

9. A device as claimed in claim 1, wherein a space inside said support members and between said plates is evacuated.

10. A device as claimed in claim 1, wherein said plates are loosely bonded to said support members by epoxy.

* * * * *